United States Patent
Kitamura et al.

(10) Patent No.: US 12,278,481 B1
(45) Date of Patent: Apr. 15, 2025

(54) POWER CONVERTER

(71) Applicant: Mitsubishi Electric Corporation, Tokyo (JP)

(72) Inventors: Ryota Kitamura, Tokyo (JP); Masafumi Ichihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/869,872

(22) PCT Filed: Oct. 11, 2022

(86) PCT No.: PCT/JP2022/037790
§ 371 (c)(1),
(2) Date: Nov. 27, 2024

(87) PCT Pub. No.: WO2024/079775
PCT Pub. Date: Apr. 18, 2024

(51) Int. Cl.
*H02M 3/158* (2006.01)
*H02H 7/12* (2006.01)
*H02M 1/088* (2006.01)

(52) U.S. Cl.
CPC .......... *H02H 7/1213* (2013.01); *H02M 1/088* (2013.01); *H02M 3/158* (2013.01)

(58) Field of Classification Search
CPC .......... H02H 7/10; H02H 7/12; H02H 7/1203; H02H 7/1206; H02H 7/12009;

(Continued)

(56) References Cited

U.S. PATENT DOCUMENTS 10,491,099 B2 * 11/2019 Yamaguchi ........... H02M 1/088
10,770,888 B2 *  9/2020 Minagawa ......... H03K 17/0828
(Continued)

FOREIGN PATENT DOCUMENTS

JP     2008-118834 A     5/2008
JP     2009-165348 A     7/2009
(Continued)

OTHER PUBLICATIONS

International Search Report and Written Opinion mailed on Dec. 27, 2022, received for PCT Application PCT/JP2022/037790, filed on Oct. 11, 2022, 8 pages including English Translation.

(Continued)

*Primary Examiner* — Jeffrey A Gblende
(74) *Attorney, Agent, or Firm* — XSENSUS LLP

(57) ABSTRACT

A power converter including transistors, a converter controller, and a functional safety controller that outputs a gate drive allowing signal. Further, there is shutoff circuitry that outputs a result of a logical conjunction using the gate pulse and the gate drive allowing signal as a drive signal, gate drive circuitry that outputs a gate signal on the basis of the drive signal, and a current detector that detects current flowing through a phase including the transistors and outputs a current value. After confirming on the basis of the current value and the gate signal that the gate signal changes to an on state during a period of no current flow through the transistor, the functional safety controller puts the gate drive allowing signal into a temporarily off state while the gate pulse is on and determines whether or not the gate signal changes to an off state.

4 Claims, 7 Drawing Sheets

(58) Field of Classification Search
CPC .. H02H 7/1213; H02H 7/1216; H02H 7/1222; H02H 7/12222; H02H 7/12225; H02H 7/12227; H02H 7/125; H02H 7/1252; H02H 7/1255; H02H 7/1257; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069

See application file for complete search history.

(56) References Cited

U.S. PATENT DOCUMENTS

| | | | | |
|---|---|---|---|---|
| 10,998,821 | B2* | 5/2021 | Shen | H02H 7/1213 |
| 11,070,046 | B2* | 7/2021 | Naka | H10D 12/411 |
| 11,705,720 | B2* | 7/2023 | Wang | H02M 1/32 |
| | | | | 361/60 |
| 2011/0215751 | A1 | 9/2011 | Sato | |
| 2014/0368232 | A1 | 12/2014 | Wu | |
| 2016/0285290 | A1 | 9/2016 | Takei et al. | |
| 2022/0091177 | A1 | 3/2022 | Degrenne et al. | |

FOREIGN PATENT DOCUMENTS

| | | |
|---|---|---|
| JP | 2011-182535 A | 9/2011 |
| JP | 2016-122702 A | 7/2016 |
| JP | 2022-509565 A | 1/2022 |
| WO | 2015/181991 A1 | 12/2015 |

OTHER PUBLICATIONS

Notice of Reasons for Refusal dated May 9, 2023, received for JP Application 2023-507778, 4 pages including English Translation.
Decision to Grant dated Aug. 1, 2023, received for JP Application 2023-507778, 5 pages including English Translation.

* cited by examiner

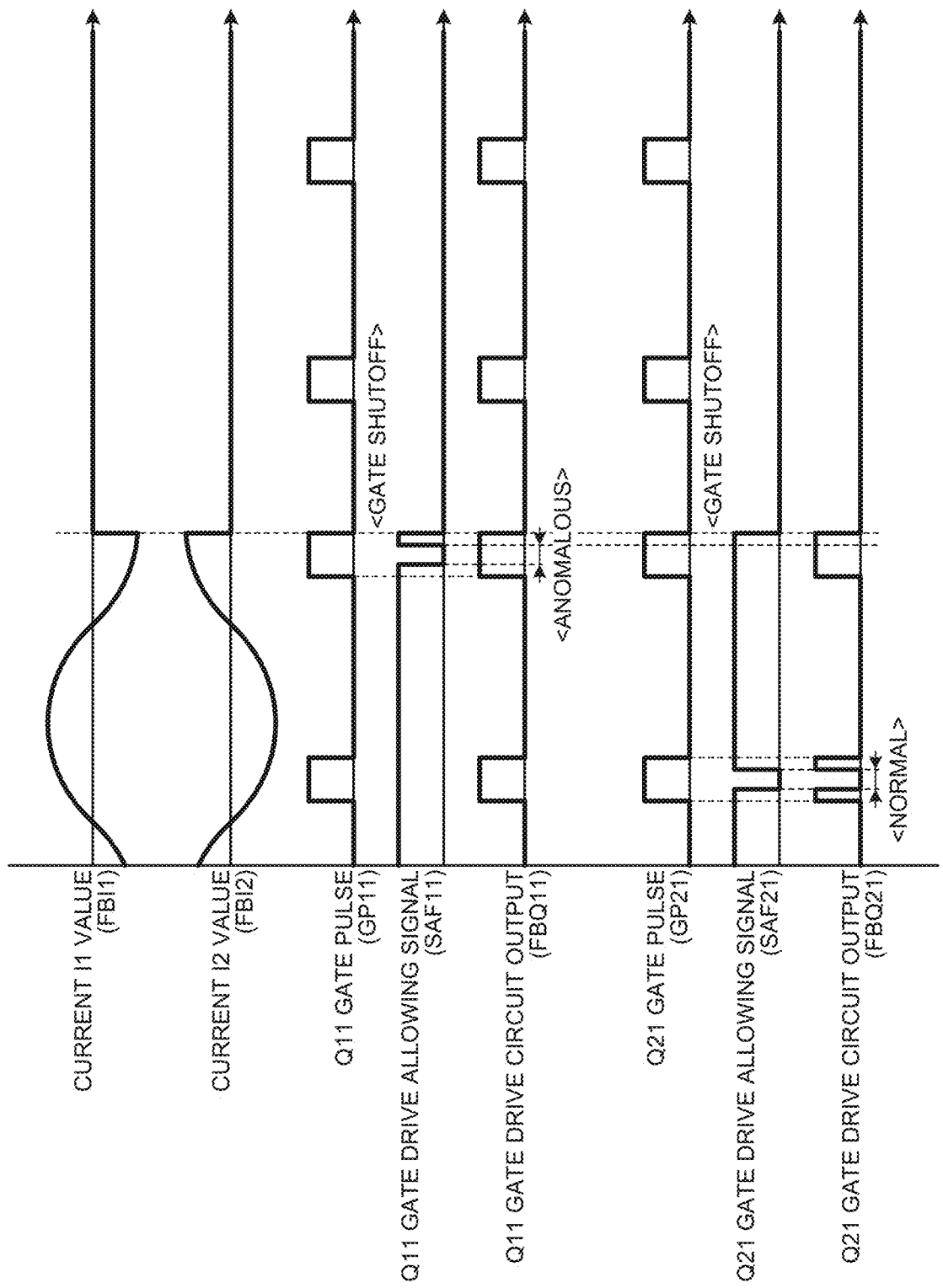

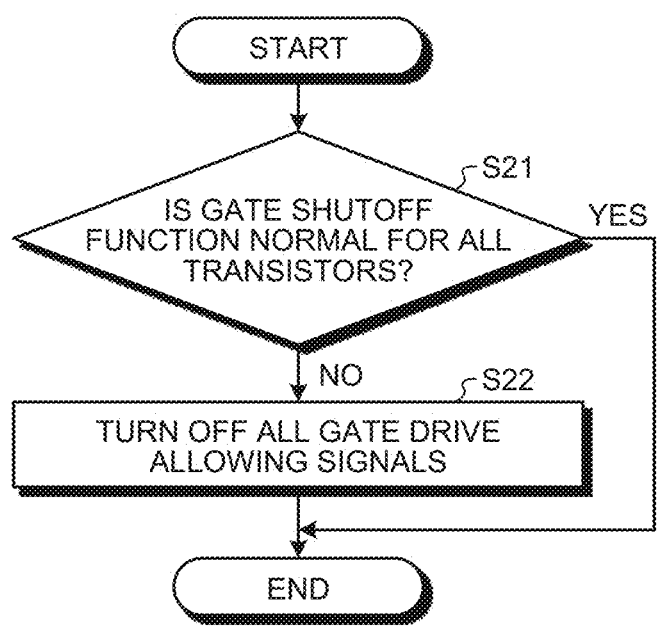

POWER CONVERTER

CROSS-REFERENCE TO RELATED APPLICATION

This application is a national stage application, pursuant to 35 U.S.C. § 371, of International Patent Application No. PCT/JP2022/037790, filed Oct. 11, 2022, the entire contents of which are incorporated herein by reference.

FIELD

The present disclosure relates to a power converter that includes transistors for power conversion.

BACKGROUND

In recent years, power converters that drive electric motors at variable speeds, such as inverters and servo amplifiers, have become increasingly prevalent due to the need for energy saving. In the meantime, manufacturers are required to enhance safety features because anomalous operation of electrical devices can lead to serious accidents. Furthermore, strict safety standards have been established at product development, design, production, maintenance, and disposal stages to keep any influences on humans within acceptable limits.

Established especially for electrical devices are a functional safety standard called International Electrotechnical Commission (IEC) 61508 and a standard called IEC 61800-5-2 that has set out in consideration of motor drive systems such as inverters and servo amplifiers.

In order to comply with these safety standards, electrical devices need to implement a functional safety system that includes a safety feature for preventing driving power from being supplied to the electrical devices and a monitoring function for monitoring the safety feature for anomalies. Circuitry constituting the functional safety system requires quantitative evaluation using Failure Modes, Effects, and Diagnostic Analysis (FMEDA) or the like to demonstrate fulfillment of a safety integrity level specified in the safety standards and also requires impact analysis for continuous management when modified. Therefore, as the circuitry is scaled up, management costs of the functional safety system increase.

When the electric motor is to be stopped, there is a Safe Torque Off (STO) function that shuts off energy supply to an electric motor. The Safe Torque Off function is implemented, for example, by a safeguard that stops the power supply from a main circuit to the electric motor. With gate drive circuitries having a shutoff function provided between the main circuit, which supplies the power to drive the electric motor, and a control device that generates control signals for controlling switching devices in the main circuit, an independently installed functional safety circuit sends shutoff commands that shut down the gate drive circuitries for shutting off the control signals. The functional safety circuit outputs the shutoff commands when Safe Torque Off command, that is, a shutoff signal is input from outside as one of those shutdown conditions for the gate drive circuitries.

However, if the shutoff signal is not input continuously, whether or not the gate drive circuitry will operate properly when the shutoff signal is actually input is uncertain. Simulating the shutoff signal input to confirm whether or not the Safe Torque Off function works properly necessitates stopping operation of a power converter, in which case an operation rate decreases. Another method is an integrity verification method that includes applying to a gate signal for the gate drive circuitry a brief confirmation pulse intended for shutoff verification and which does not allow a transistor of the main circuit to respond, and checking how the gate drive circuitry responds.

However, limiting the duration of the confirmation pulse has become difficult due to the following aspects. Firstly, as wafers of transistors used as switching devices in the main circuit have become thinner, a fast shutoff during an anomaly has become necessary; therefore, the gate drive circuitries need to respond quickly, in which case the transistors respond even to brief confirmation pulses. Consequently, during integrity verification of the Safe Torque Off function, an increased error in output voltage from the main circuit results. Secondly, a next-generation switching device, such as a silicon carbide (Sic) transistor, features an even faster switching speed, leading to higher-frequency switching harnessing this feature. Accordingly, the entire gate drive circuitry, combined with a shutoff circuitry, needs to respond more quickly, in which case the transistor responds even to a brief confirmation pulse. Because a gate state is different from the command of the control device during the shutoff verification, the error of the output voltage from the main circuit increases as a result.

Addressing these problems, a technique disclosed in Patent Literature 1 allows for verification of integrity of a gate shutoff function without affecting converter control by shutting off power supply to a photocoupler as a gate drive element when a converter control gate pulse is off within one switching cycle of pulse-width modulation (PWM) control and monitoring a power shutoff state to check if the gate shutoff function is operative.

CITATION LIST

Patent Literature

Patent Literature 1: Japanese Patent Application Laid-open No. 2016-127702

SUMMARY OF INVENTION

Problems to be Solved by the Invention

However, a problem with the above conventional technique is that an output-side anomaly of the gate drive element and an actual state of a gate signal input to a transistor cannot be checked. Furthermore, the above conventional technique requires transmitting information on switching timing of the PWM control to a functional safety system to time the above-mentioned confirmation of the gate shutoff function's operativeness to a brief period when the converter control gate pulse is off within the one switching cycle of the PWM control, in which case the functional safety system and a converter control system cannot hold their independence.

The present disclosure has been made in view of the above, and an object of the present disclosure is to obtain a power converter that enables integrity verification of a gate shutoff function for transistors that are used for power conversion, with normal operation unaffected.

Means to Solve the Problems

To solve the above problems and achieve the object, a power converter according to the present disclosure includes: a pair of transistors connected in series to be used in power conversion; a converter controller configured to output a gate pulse specific to each of the transistors in performing on and off control of the transistors; a functional safety controller configured to output a gate drive allowing signal specific to each of the transistors in an on state when not determining integrity of a gate shutoff function for the transistors; a pair of shutoff circuitries, corresponding to the pair of transistors respectively, each configured to output a result of a logical conjunction that uses the gate pulse and the gate drive allowing signal; a pair of gate drive circuitries corresponding to the pair of transistors respectively, each configured to output a gate signal to drive the transistor on a basis of the drive signal to the transistor and the functional safety controller; and a current detector configured to detect current flowing through a phase including the pair of transistors and configured to output a detection result as a current value to the functional safety controller. For each of the transistors, after confirming on a basis of the current value and the gate signal that the gate signal changes to an on state during a period of no current flow through the transistor, the functional safety controller is configured to: put the gate drive allowing signal into a temporarily off state while the gate pulse is on; and determine whether or not the gate signal changes to an off state.

Effect of the Invention

The power converter according to the present disclosure has an effect of enabling integrity verification of the gate shutoff function of the transistors used for the power conversion with the normal operation unaffected.

BRIEF DESCRIPTION OF DRAWINGS

FIG. 7 is a second diagram illustrating exemplary operating waveforms of the power converter according to the second embodiment.

FIG. 8 is a flowchart illustrating how the power converter according to the second embodiment operates.

DESCRIPTION OF EMBODIMENTS

Hereinafter, with reference to the drawings, a detailed description of power converters according to embodiments of the present disclosure will be provided.

First Embodiment

Figure 1:
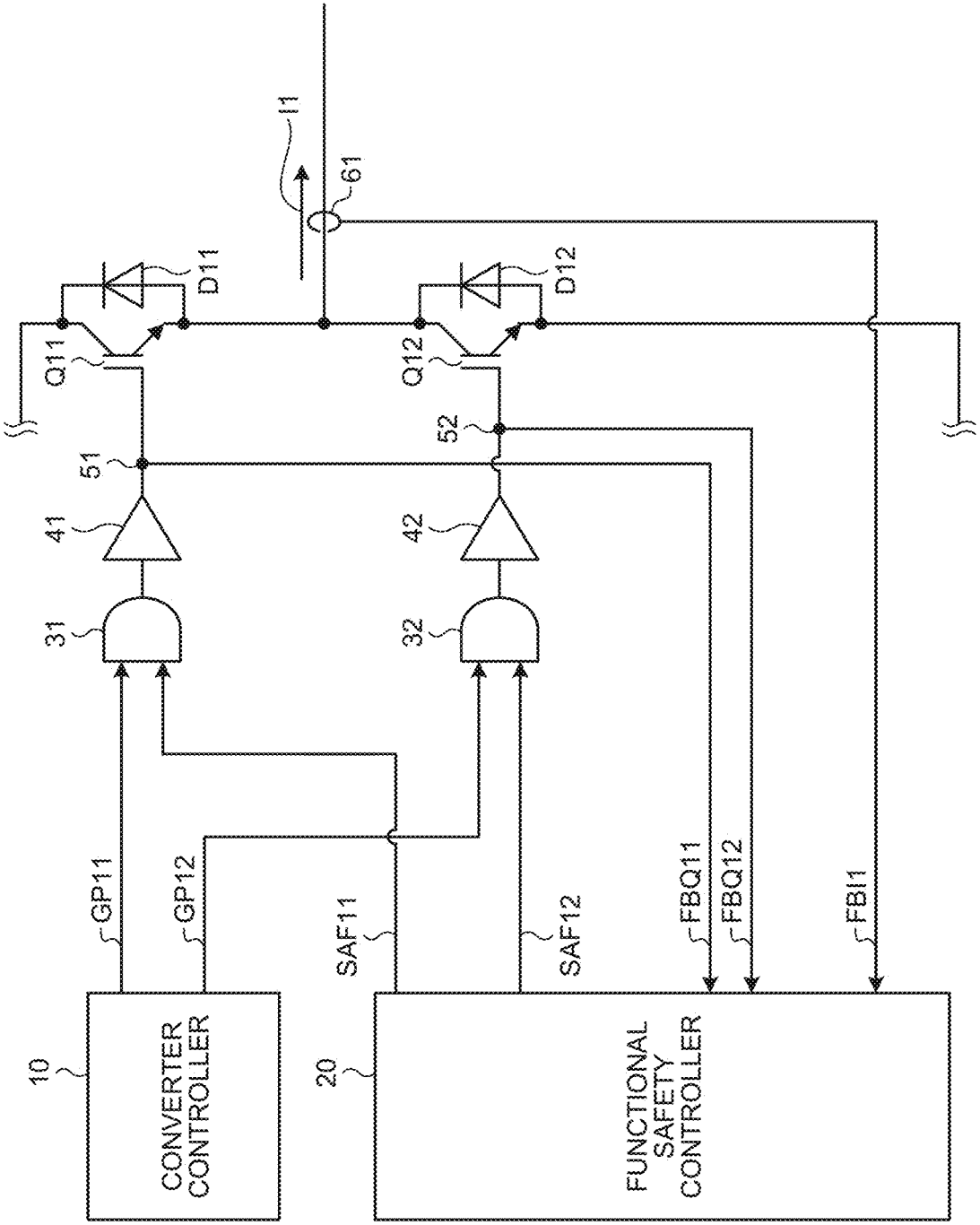
FIG. 1 is a diagram illustrating an exemplary configuration of a power converter according to a first embodiment.

FIG. 1 is a diagram illustrating an exemplary configuration of a power converter 1 according to a first embodiment.

The power converter 1 includes: a converter controller 10; a functional safety controller 20; shutoff circuitries 31 and 32; gate drive circuitries 41 and 42; gate signal bifurcation units 51 and 52; transistors Q11 and Q12; freewheeling diodes D11 and D12; and a current detector 61.

The converter controller 10 is a controller that performs normal power conversion control in the power converter 1. The converter controller 10 outputs gate pulses GP11 to the shutoff circuitry 31 for performing the power conversion control, namely gate-on and gate-off control of the transistor Q11 in a main circuit. Similarly, the converter controller 10 outputs gate pulses GP12 to the shutoff circuitry 32 for performing the power conversion control, namely gate-on and gate-off control of the transistor Q12 in the main circuit. In other words, the converter controller 10 outputs the gate pulses GP11 and GP12 specific to the transistors Q11 and Q12 for the on and off control of the transistors Q11 and Q12. In the following description, the term "gate-on" may be simply referred to as "on", and the term "gate-off" may be simply referred to as "off". An example of the main circuit in the power converter 1 is an inverter that supplies power to an electric motor (not illustrated) or the like but is not limiting.

The functional safety controller 20 is a controller that performs functional safety control in the power converter 1. The functional safety control corresponds to control by a functional safety system that includes, as described in the background, a safety feature for preventing driving power from being supplied to an electrical device and a monitoring function for monitoring the safety feature for anomalies. In the first embodiment, the functional safety control refers to controlling a function of safely stopping the power converter 1, specifically controlling gate shutoff execution and integrity verification of a gate shutoff function. The functional safety controller 20 outputs a gate drive allowing signal SAF11 for functional safety control to the shutoff circuitry 31 and a gate drive allowing signal SAF12 for functional safety control to the shutoff circuitry 32. Under normal conditions, the functional safety controller 20 outputs the gate drive allowing signals SAF11 and SAF12 in an on state. The phrase "under normal conditions" refers to a state of the power converter 1 where the integrity verification of the gate shutoff function and the gate shutoff are not being performed. When not under normal conditions, the power converter 1 is in a state where the integrity verification of the gate shutoff function and the gate shutoff are being performed. As described above, the functional safety controller 20 outputs the gate drive allowing signal SAF11 in the on state for the transistor Q11 when not determining the integrity of the gate shutoff function for the transistor Q11. The functional safety controller 20 outputs the gate drive allowing signal SAF12 in the on state for the transistor Q12 when not determining the integrity of the gate shutoff function for the transistor Q12.

Corresponding to the transistor Q11, the shutoff circuitry 31 outputs a drive signal in an on state to drive the gate drive circuitry 41 when a gate pulse GP11 output from the converter controller 10 and the gate drive allowing signal SAF11 output from the functional safety controller 20 are both on. Specifically, the shutoff circuitry 31 is an AND circuit that performs a logical conjunction using the gate pulse GP11 and the gate drive allowing signal SAF11 and outputs a result of the logical conjunction as the drive signal. Similarly, corresponding to the transistor Q12, the shutoff circuitry 32 outputs a drive signal in the on state to drive the gate drive circuitry 42 when a gate pulse GP12 output from the converter controller 10 and the gate drive allowing signal SAF12 output from the functional safety controller 20 are both on. Specifically, the shutoff circuitry 32 is an AND circuit that performs a logical conjunction using the gate pulse GP12 and the gate drive allowing signal SAF12 and outputs a result of the logical conjunction as the drive signal.

Since the shutoff circuitry 31 operates as described above, the functional safety controller 20 is enabled to put the output of the shutoff circuitry 31 into an off state by putting the gate drive allowing signal SAF11 for the shutoff circuitry 31 into an off state. In other words, the functional safety controller 20 in the power converter 1 can shut off the gate pulse GP11, which is output from the converter controller 10 for the normal power conversion control, to put the transistor Q11 into a gate-off state. Since the shutoff circuitry 32 operates as described above, the functional safety controller 20 is also enabled to put the output of the shutoff circuitry 32 into the off state by putting the gate drive allowing signal SAF12 for the shutoff circuitry 32 into the off state. In other words, the functional safety controller 20 in the power converter 1 can shut off the gate pulse GP12, which is output from the converter controller 10 for the normal power conversion control, to put the transistor Q12 into the gate-off state.

Corresponding to the transistor Q11, the gate drive circuitry 41 outputs a gate signal to drive the transistor Q11 on the basis of the drive signal output from the shutoff circuitry 31. In other words, the gate drive circuitry 41 drives the transistor Q11 according to the drive signal output from the shutoff circuitry 31. Specifically, the gate drive circuitry 41 outputs the gate signal in an on state when the drive signal is on, and outputs the gate signal in an off state when the drive signal is off. Similarly, corresponding to the transistor Q12, the gate drive circuitry 42 outputs a gate signal to drive the transistor Q12 on the basis of the drive signal output from the shutoff circuitry 32. In other words, the gate drive circuitry 42 drives the transistor Q12 according to the drive signal output from the shutoff circuitry 32. Specifically, the gate drive circuitry 42 outputs the gate signal in the on state when the drive signal is on, and outputs the gate signal in the off state when the drive signal is off.

The gate signal bifurcation unit 51 bifurcates the gate signal that the gate drive circuitry 41 outputs to the transistor Q11. The gate signal bifurcation unit 51 outputs one of the bifurcated gate signals to the transistor Q11 and feeds back to the functional safety controller 20 the other bifurcated gate signal in the form of a gate signal FBQ11 as a feedback signal for the functional safety controller 20. Similarly, the gate signal bifurcation unit 52 bifurcates the gate signal that the gate drive circuitry 42 outputs to the transistor Q12. The gate signal bifurcation unit 52 outputs one of the bifurcated gate signals to the transistor Q12 and feeds back to the functional safety controller 20 the other bifurcated gate signal in the form of a gate signal FBQ12 as a feedback signal for the functional safety controller 20.

The gate signal output from the gate drive circuitry 41 to the transistor Q11 herein has a greater current value than the drive signal output from the shutoff circuitry 31 to the gate drive circuitry 41 due to the need to control the operation of the transistor Q11. Therefore, if the gate signal bifurcation unit 51 simply bifurcates the gate signal, a large current will flow to the functional safety controller 20 as the gate signal FBQ11. For this reason, the gate signal bifurcation unit 51 bifurcates the gate signal output from the gate drive circuitry 41 to the transistor Q11 so that the gate signal FBQ11 to be fed back to the functional safety controller 20 has a current value less than or equal to a specified current value. Taking into consideration the amount of current to be distributed to the functional safety controller 20 by the gate signal bifurcation unit 51, the shutoff circuitry 31 may output a drive signal with a greater current value in advance to ensure a necessary amount of current for controlling the operation of the transistor Q11. Similarly, the gate signal output from the gate drive circuitry 42 to the transistor Q12 has a greater current value than the drive signal output from the shutoff circuitry 32 to the gate drive circuitry 42 due to the need to control the operation of the transistor Q12. Therefore, if the gate signal bifurcation unit 52 simply bifurcates the gate signal, a large current will flow to the functional safety controller 20 as the gate signal FBQ12. For this reason, the gate signal bifurcation unit 52 bifurcates the gate signal output from the gate drive circuitry 42 to the transistor Q12 so that the gate signal FBQ12 to be fed back to the functional safety controller 20 has a current value less than or equal to a specified current value. Taking into consideration the amount of current to be distributed to the functional safety controller 20 by the gate signal bifurcation unit 52, the shutoff circuitry 32 may output a drive signal with a greater current value in advance to ensure a necessary amount of current for controlling the operation of the transistor Q12. The large currents may be prevented from flowing to the functional safety controller 20 in the power converter 1 by adjusting input impedances of the transistors Q11 and Q12 and the functional safety controller 20. In that case, each of the gate signal bifurcation units 51 and 52 does not have to have the above-described function.

In the power converter 1, the gate drive circuitry 41 can be said to output the gate signal to the transistor Q11 and the functional safety controller 20 via the gate signal bifurcation unit 51. Similarly, the gate drive circuitry 42 can be said to output the gate signal to the transistor Q12 and the functional safety controller 20 via the gate signal bifurcation unit 52.

The transistor Q11 is a switching device that is included in the main circuit to perform power conversion in the power converter 1. The power conversion transistor Q11 to be used for power conversion turns on and off according to the gate signal, which is output from the gate drive circuitry 41. Specifically, the transistor Q11 enters a gate-on state when the gate signal is on and the gate-off state when the gate signal is off. Similarly, the transistor Q12 is a switching device that is included in the main circuit to perform power conversion in the power converter 1. The power conversion transistor Q12 to be used for power conversion turns on and off according to the gate signal, which is output from the gate drive circuitry 42. Specifically, the transistor Q12 enters the gate-on state when the gate signal is on and the gate-off state when the gate signal is off. In the first embodiment, the transistors Q11 and Q12 do not enter the gate-on state simultaneously.

The freewheeling diode D11 is a diode connected in parallel with the transistor Q11. Similarly, the freewheeling diode D12 is a diode connected in parallel with the transistor Q12.

The current detector 61 detects current I1 flowing through a phase that includes the transistors Q11 and Q12. The current I1 flowing through the phase refers to the current flowing through an interconnect line between the power converter 1 and the electric motor (not illustrated) or the like to which the power converter 1 supplies the power. Specifically, the current detector 61 detects the current I1 that flows through the transistor Q11, the freewheeling diode D11, the transistor Q12, or the freewheeling diode D12. The current detector 61 outputs a detection result, namely the detected current I1, to the functional safety controller 20 in the form of a current value FBI1 as a feedback signal for the functional safety controller 20. The current I1 is positive when flowing in a direction indicated by an arrow in FIG. 1 and negative when flowing in a direction opposite to the arrow in FIG. 1. In the example of FIG. 1, the current I1 is positive when flowing through the transistor Q11 or the freewheeling diode D12 and negative when flowing through the freewheeling diode D11 or the transistor Q12.

The functional safety controller 20 monitors: the gate signal FBQ11 being fed back from the gate signal bifurcation unit 51; the gate signal FBQ12 being fed back from the gate signal bifurcation unit 52; and the current value FBI1 being output from the current detector 61. In other words, the functional safety controller 20 monitors: the gate signal being output from the gate drive circuitry 41 to the transistor Q11; the gate signal being output from the gate drive circuitry 42 to the transistor Q12; and the current I1 flowing through the transistor Q11, the freewheeling diode D11, the transistor Q12, or the freewheeling diode D12.

Next, a description is provided of a mechanism for verifying the integrity of the gate shutoff function in the power converter 1. In the first embodiment, the gate shutoff function refers to the feature of putting the transistors Q11 and Q12 into the gate-off state when some anomaly is detected in the power converter 1.

In the power converter 1, the current I1 flows through the transistor Q11 or the freewheeling diode D12 in the positive direction and flows through the freewheeling diode D11 or the transistor Q12 in the negative direction. When the current I1 is flowing through the freewheeling diode D11, the current I1 keeps on flowing through the freewheeling diode D11 without flowing through the transistor Q11 even when the transistor Q11 enters the gate-on state. Therefore, even if the transistor Q11 is put into the gate-on state while the current I1 flows in the negative direction, the current I1 does not flow through the transistor Q11, meaning that output voltage generation of the power converter 1 through the original converter control is unaffected. Similarly, when the current I1 is flowing through the freewheeling diode D12, the current I1 keeps on flowing through the freewheeling diode D12 without flowing through the transistor Q12 even when the transistor Q12 enters the gate-on state. Therefore, even if the transistor Q12 is put into the gate-on state while the current I1 flows in the positive direction, the current I1 does not flow through the transistor Q12, meaning that the output voltage generation of the power converter 1 through the original converter control is unaffected.

Since the current value FBI1 is fed back from the current detector 61, the functional safety controller 20 can detect whether the flowing direction of the current I1 is positive or negative on the basis of the current value FBI1. Furthermore, since the gate signal FBQ11 is fed back from the gate signal bifurcation unit 51, the functional safety controller 20 can detect the state of the gate signal applied to the transistor Q11. Given these, the functional safety controller 20 first detects the period when the current I1 flows in the negative direction on the basis of the current value FBI1 fed back from the current detector 61. Even during the period when the current I1 flows in the negative direction, regardless of how the functional safety controller 20 or the like operates, the converter controller 10 controls operation of a device connected to the power converter 1 as during the period when the current I1 flows in the positive direction, appropriately outputting a gate pulse GP11 in the on or off state.

Since, as described earlier, the functional safety controller 20 outputs the gate drive allowing signal SAF11 in the on state, the shutoff circuitry 31 outputs the drive signal in the on state to the gate drive circuitry 41 when a gate pulse GP11 set by the converter controller 10 is on. As a result, the gate drive circuitry 41 outputs the gate signal in the on state to the transistor Q11 on the basis of the drive signal in the on state from the shutoff circuitry 31. The gate signal bifurcation unit 51 bifurcates the gate signal output in the on state from the gate drive circuitry 41 to the transistor Q11, thus feeding back the gate signal FBQ11 to the functional safety controller 20. With the gate signal FBQ11, which is the feedback from the gate signal bifurcation unit 51, the functional safety controller 20 can detect that the gate signal output from the gate drive circuitry 41 is on.

The functional safety controller 20 turns off the gate drive allowing signal SAF11 while the gate drive circuitry 41 outputs the gate signal in the on state in the period when the current I1 flows in the negative direction. Since the gate drive allowing signal SAF11 output from the functional safety controller 20 has entered the off state, the shutoff circuitry 31 outputs the drive signal in the off state to the gate drive circuitry 41. On the basis of the drive signal in the off state from the shutoff circuitry 31, the gate drive circuitry 41 outputs the gate signal in the off state to the transistor Q11. The gate signal bifurcation unit 51 bifurcates the gate signal output in the off state from the gate drive circuitry 41 to the transistor Q11 to feed back the gate signal FBQ11 to the functional safety controller 20.

With the gate signal FBQ11, which is the feedback from the gate signal bifurcation unit 51, the functional safety controller 20 can detect that the gate signal output from the gate drive circuitry 41 is off. The gate signal for the transistor Q11 has turned off as a result of turning off the gate drive allowing signal SAF11. This allows the functional safety controller 20 to determine that the gate shutoff function is normal. If after turning off the gate drive allowing signal SAF11 while the gate drive circuitry 41 outputs the gate signal in the on state in the period when the current I1 flows in the negative direction, the functional safety controller 20 cannot detect on the basis of the gate signal FBQ11, which is the feedback from the gate signal bifurcation unit 51, that the gate signal output from the gate drive circuitry 41 is off, the functional safety controller 20 determines that the gate shutoff function is anomalous.

Figure 2:
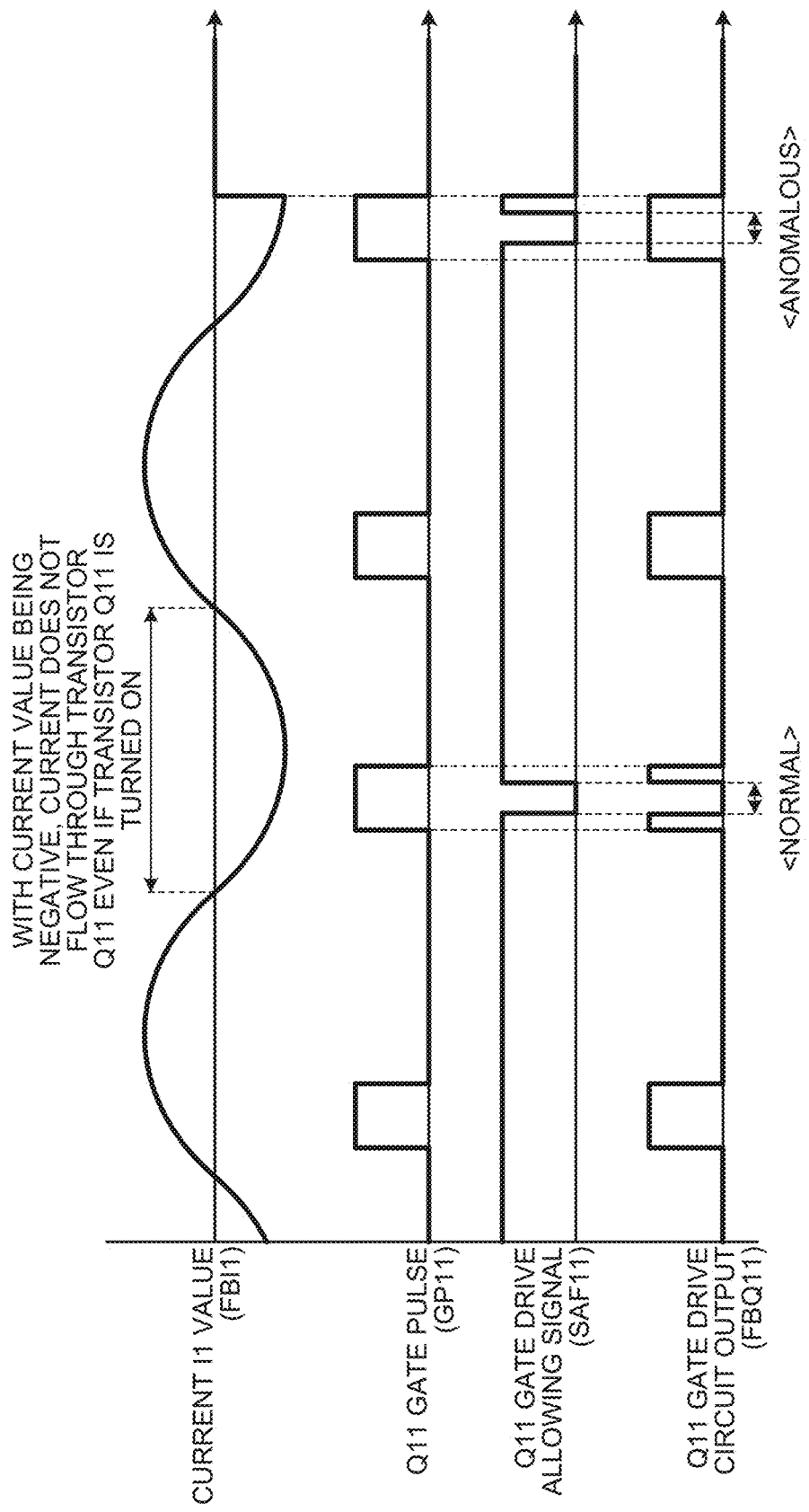
FIG. 2 is a diagram illustrating exemplary operating waveforms of the power converter according to the first embodiment.

FIG. 2 is a diagram illustrating exemplary operating waveforms of the power converter 1 according to the first embodiment. In FIG. 2, "current I1 value" corresponds to the current I1 being detected by the current detector 61 and refers to the current value FBI1 fed back from the current detector 61 to the functional safety controller 20. "Q11 gate pulse" refers to the gate pulse GP11 that is output from the converter controller 10. "Q11 gate drive allowing signal" refers to the gate drive allowing signal SAF11 that is output from the functional safety controller 20. "Q11 gate drive circuitry output" refers to the gate signal FBQ11 that is fed back from the gate signal bifurcation unit 51 to the functional safety controller 20, corresponding to the gate signal that is output from the gate drive circuitry 41 to the transistor Q11. Those signals relating to the transistor Q12, namely the gate pulse GP12, the gate drive allowing signal SAF12, and the gate signal FBQ12 are not illustrated.

After confirming that the gate signal output from the gate drive circuitry 41, namely the gate signal FBQ11, has changed to the on state during the period of the current I1 flowing in the negative direction, the functional safety controller 20 puts the gate drive allowing signal SAF11 into a temporarily off state while the gate pulse GP11 is on. If the gate signal being output from the gate drive circuitry 41, namely the gate signal FBQ11, turns off accordingly, the functional safety controller 20 determines that the gate shutoff function is normal. If the functional safety controller 20 cannot detect that the gate signal being output from the gate drive circuitry 41, namely the gate signal FBQ11, turns off under the same condition as described above, the functional safety controller 20 determines that the gate shutoff function is anomalous.

Here, the functional safety controller 20 is unaware of how long the converter controller 10 outputs the gate pulse GP11 in the on state. However, if preset with information on the shortest duration for which the converter controller 10 keeps the gate pulse GP11 on when putting the gate pulse GP11 into the on state, the functional safety controller 20 can put the gate drive allowing signal SAF11 into the temporarily off state, that is to say, turn the gate drive allowing signal SAF11 off and then on again within the shortest duration for which the gate pulse GP11 is on to perform the above-described operation. The functional safety controller 20 may select an on-period that is shortest among periods when the gate signal FBQ11, which is fed back from the gate signal bifurcation unit 51, is on during the operation of the power converter 1 within a specified period as the shortest duration for which the gate pulse GP11 stays on. In cases where the power converter 1 supplies the power to the electric motor (not illustrated), the power converter 1 generally makes no extreme changes to its control halfway through to effect smooth operation of the electric motor. When an on-period of a previous gate pulse GP11 is equal to or longer than a specified period, the functional safety controller 20 can anticipate securing a certain length of time for a subsequent gate pulse GP11 to be on, even if this on-period becomes shorter than the previous one. Therefore, the functional safety controller 20 may put the gate drive allowing signal SAF11 into the temporarily off state during the on-period of the subsequent gate pulse GP11, the certain length of time for the subsequent gate pulse GP11 to be on, which the functional safety controller 20 can anticipate securing on the basis of the on-period of the previous gate pulse GP11.

The functional safety controller 20 in the power converter 1 determines on the basis of the current value FBI1 and the gate signal FBQ11 whether or not the gate signal for the transistor Q11 changes to the off state by putting the gate drive allowing signal SAF11 into the temporarily off state while the gate signal is on in the period when the current I1 flows in the negative direction, that is to say, does not flow through the transistor Q11. In this way, the functional safety controller 20 determines the integrity of the gate shutoff function for the transistor Q11.

Figure 3:
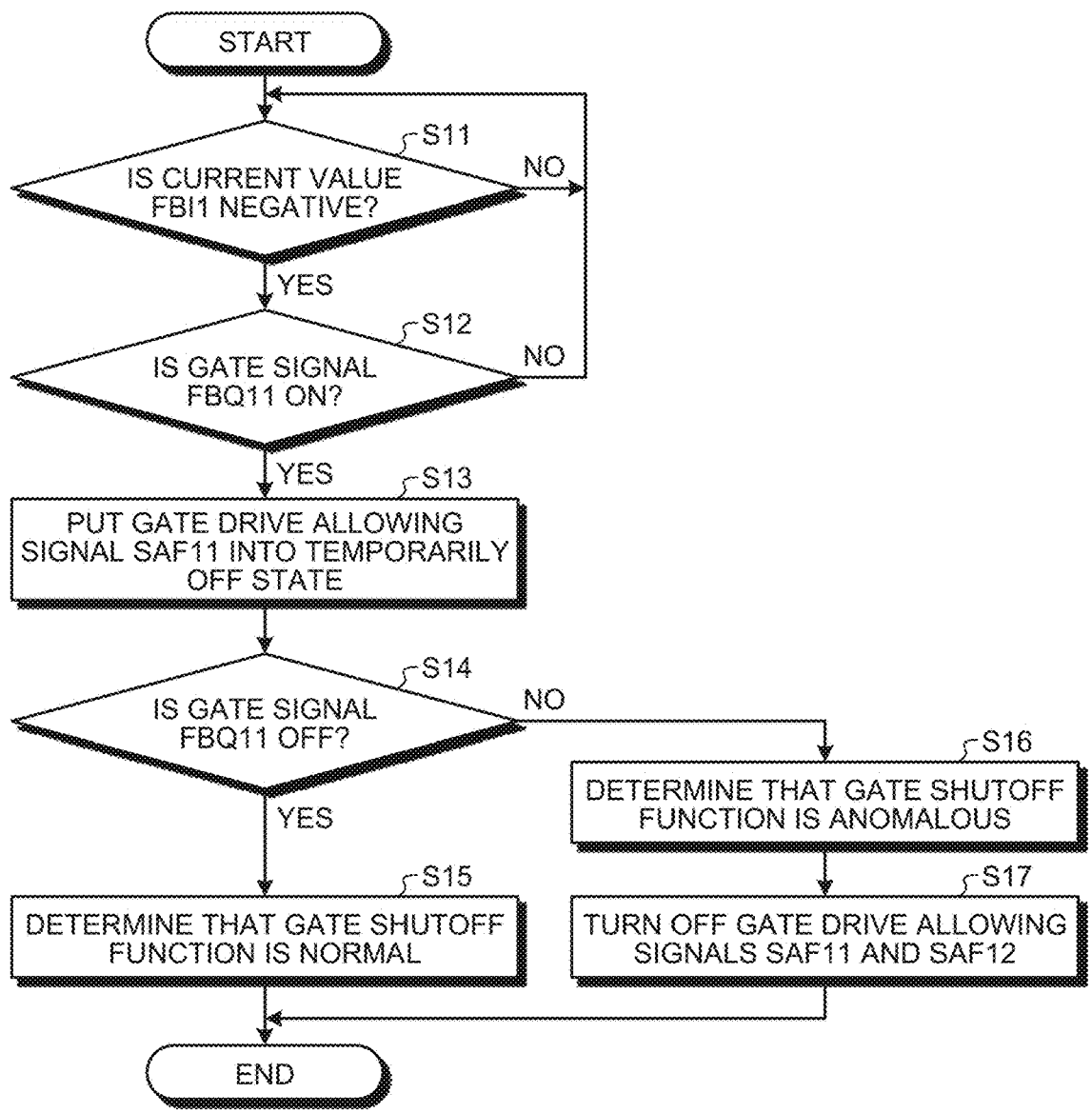
FIG. 3 is a flowchart illustrating how the power converter according to the first embodiment operates.

With reference to a flowchart, a description is provided of how the power converter 1 operates. FIG. 3 is the flowchart illustrating the operation of the power converter 1 according to the first embodiment. In the power converter 1, the functional safety controller 20 determines whether the flowing direction of the current I1 is negative or not, that is to say, whether the current value FBI1 fed back from the current detector 61 is negative or not (step S11). If the current value FBI1 is positive (step S11: No), the functional safety controller 20 performs the operation of step S11 again. If the current value FBI1 is negative (step S11: Yes), the functional safety controller 20 checks whether the gate signal being output from the gate drive circuitry 41 to the transistor Q11 is on or not, that is to say, whether the gate signal FBQ11 being fed back from the gate signal bifurcation unit 51 is on or not (step S12). If the gate signal FBQ11 is off (step S12: No), the functional safety controller 20 performs the operation of step S11 again.

If the gate signal FBQ11 is on (step S12: Yes), the functional safety controller 20 puts the gate drive allowing signal SAF11 into the temporarily off state while the gate signal FBQ11 is on (step S13). The functional safety controller 20 checks whether or not the gate signal being output from the gate drive circuitry 41 to the transistor Q11 has changed to the off state, that is to say, whether or not the gate signal FBQ11 being fed back from the gate signal bifurcation unit 51 has changed to the off state after the gate drive allowing signal SAF11 has been put into the temporarily off state (step S14). If the gate signal FBQ11 has changed to the off state (step S14: Yes), the functional safety controller 20 determines that the gate shutoff function is normal (step S15). Specifically, if the functional safety controller 20 can confirm that changing the gate drive allowing signal SAF11 from the on state off to the temporarily off state and then to the on state again causes the gate signal FBQ11 being fed back from the gate signal bifurcation unit 51 to change from the on state to the off state and then to the on state accordingly, the functional safety controller 20 determines that the gate shutoff function is normal. If the gate signal FBQ11 has not changed to the off state (step S14: No), the functional safety controller 20 determines that the gate shutoff function is anomalous (step S16). If the gate signal FBQ11 changes to the off state when the gate drive allowing signal SAF11 turns off but does not change to the on state when the gate drive allowing signal SAF11 turns on again, the functional safety controller 20 may determine that the gate shutoff function is anomalous. Upon determining that the gate shutoff function is anomalous, the functional safety controller 20 turns off the gate drive allowing signals SAF11 and SAF12 (step S17).

As illustrated in FIG. 2, in the determination of the integrity of the gate shutoff function for the transistor Q11, when an anomaly is detected, there is a possibility that even turning off the gate drive allowing signal SAF11 does not enable the functional safety controller 20 to turn off the gate signal FBQ11 serving as the feedback signal, namely the gate signal being output from the gate drive circuitry 41 to the transistor Q11. However, the functional safety controller 20 can turn off the gate signal being output from the gate drive circuitry 42 to the transistor Q12 by turning off the gate drive allowing signal SAF12 for the transistor Q12. In such a case, the functional safety controller 20 may issue an alarm to notify, for example, a user of the power converter 1 of the detected anomaly relating to the integrity of the gate shutoff function, and if stopping the operation of the power converter 1 is desired, the functional safety controller 20 may perform control that shuts off power supply to the converter controller 10 to stop the output of gate pulses GP11 and GP12 from the converter controller 10. In this way, the functional safety controller 20 can put both the transistors Q11 and Q12 into the gate-off state.

While the description has been provided of how the functional safety controller 20 operates to determine the integrity of the gate shutoff function for the transistor Q11, the functional safety controller 20 operates in the same manner to determine the integrity of the gate shutoff function for the transistor Q12. In determining the integrity of the gate shutoff function for the transistor Q12, the functional safety controller 20 checks whether or not the gate signal FBQ12 turns off by putting the gate drive allowing signal SAF12 into the temporarily off state while the transistor Q12 is in the gate-on state, with the current I1 flowing in the positive direction.

As described above, for the transistor Q11, after confirming on the basis of the current value of the current I1 and the gate signal FBQ11 that the gate signal FBQ11 changes to the on state during the period of no current flow through the transistor Q11, the functional safety controller 20 puts the gate drive allowing signal SAF11 into the temporarily off state while the gate pulse GP11 is on to determine whether or not the gate signal FBQ11 changes to the off state. Similarly for the transistor Q12, after confirming on the basis of the current value of the current I1 and the gate signal FBQ12 that the gate signal FBQ12 changes to the on state during the period of no current flow through the transistor Q12, the functional safety controller 20 puts the gate drive allowing signal SAF12 into the temporarily off state while the gate pulse GP12 is on to determine whether or not the gate signal FBQ12 changes to the off state. Upon determining an anomaly in the gate shutoff function for one of the transistors, the functional safety controller 20 turns off the gate drive allowing signals SAF11 and SAF12 for the two transistors Q11 and Q12.

Figure 4:
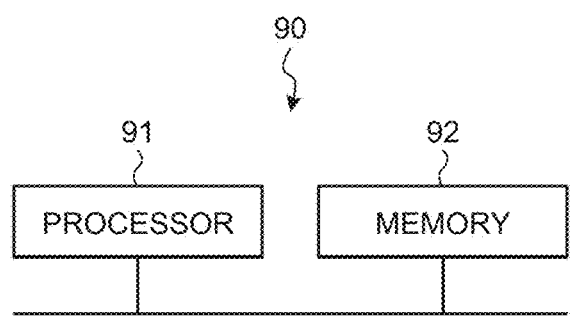
FIG. 4 is a diagram illustrating an exemplary configuration of hardware that implements processing circuitry of the power converter according to the first embodiment.

A description is provided next of a hardware configuration that implements the power converter 1 according to the first embodiment. The shutoff circuitries 31 and 32 of the power converter 1 are electrical circuits that each constitute the AND circuit. The gate drive circuitries 41 and 42 are electrical circuits that amplify current values of the drive signals output from the shutoff circuitries 31 and 32. The gate signal bifurcation units 51 and 52 are electrical circuits that bifurcate the gate signals. The current detector 61 is a sensor. The transistors Q11 and Q12 and the freewheeling diodes D11 and D12 are semiconductor elements. The converter controller 10 and the functional safety controller 20 are implemented with processing circuitry. FIG. 4 is a diagram illustrating an exemplary configuration of hardware that implements the processing circuitry of the power converter 1 according to the first embodiment. FIG. 4 illustrates the exemplary configuration of the processing circuitry 90 that includes a processor 91 and a memory 92 to implement the converter controller 10 and the functional safety controller 20.

The processor 91 is a central processing unit (CPU). The processor 91 may be an arithmetic unit, a microprocessor, a microcomputer, or a digital signal processor (DSP). The memory 92 includes, for example, a volatile or nonvolatile semiconductor memory, such as a random-access memory (RAM), a read-only memory (ROM), a flash memory, an erasable programmable read-only memory (EPROM), or an electrically erasable programmable read-only memory (EE-PROM) (registered trademark).

The memory 92 stores programs that operate as the converter controller 10 and the functional safety controller 20. By reading out and executing these programs, the processor 91 can implement the converter controller 10 and the functional safety controller 20. When stored in the memory 92, the programs that operate as the converter controller 10 and the functional safety controller 20 may be written to a storage medium, such as a compact disc (CD)-ROM or a digital versatile disc (DVD)-ROM, and provided to the user or the like or may be provided via a network. The processor 91 outputs data, such as operation results, to a volatile memory of the memory 92. Alternatively, the processor 91 outputs the operation results and other data to an auxiliary storage unit via the volatile memory of the memory 92.

While FIG. 4 illustrates the exemplary hardware that includes the general-purpose processor 91 and the memory 92 to implement the converter controller 10 and the functional safety controller 20, the converter controller 10 and the functional safety controller 20 may be implemented with dedicated processing circuitry instead of the processor 91 and the memory 92. The dedicated processing circuitry herein refers to a single circuit, a composite circuit, an application-specific integrated circuit (ASIC), a field-programmable gate array (FPGA), or a combination of these. The converter controller 10 and the functional safety controller 20 may be implemented partly with the processor 91 and the memory 92 and for the rest, with dedicated processing circuitry.

According to the first embodiment described above, the functional safety controller 20 of the power converter 1 determines the period when the current I1 does not flow through the transistor Q11 on the basis of the current value FBI1 from the current detector 61 and determines the on-period of the gate signal for the transistor Q11 on the basis of the gate signal FBQ11 from the gate signal bifurcation unit 51. The functional safety controller 20 puts the gate drive allowing signal SAFI 1 into the temporarily off state while the gate signal for the transistor Q11 is on in the period when the current I1 does not flow through the transistor Q11 to determine whether or not the gate signal for the transistor Q11 changes to the off state, thus determining the integrity of the gate shutoff function for the transistor Q11. Similarly, the functional safety controller 20 determines the period when the current I1 does not flow through the transistor Q12 on the basis of the current value FBI1 from the current detector 61 and determines the on-period of the gate signal for the transistor Q12 on the basis of the gate signal FBQ12 from the gate signal bifurcation unit 52. The functional safety controller 20 puts the gate drive allowing signal SAF12 into the temporarily off state while the gate signal for the transistor Q12 is on in the period when the current I1 does not flow through the transistor Q12 to determine whether or not the gate signal for the transistor Q12 changes to the off state, thus determining the integrity of the gate shutoff function for the transistor Q12. In this way, the functional safety controller 20 can verify the integrity of the gate shutoff function for the transistors Q11 and Q12, which are used for power conversion, without affecting the normal operation of the power converter 1.

Furthermore, the functional safety controller 20 can verify the integrity of the gate shutoff function for the transistors Q11 and Q12 of the main circuit without using brief confirmation pulses that do not allow the main circuit to respond. Furthermore, the functional safety controller 20 can monitor the output states of the gate drive circuitries 41 and 42 and therefore, can also verify state integrity of the gate signals actually input to the transistors Q11 and Q12. Furthermore, the functional safety controller 20 operates independently without obtaining control timing information or the like from the converter controller 10; therefore, the converter controller 10 and the functional safety controller 20 can hold their independence. Furthermore, the functional safety controller 20 can verify the integrity of the gate shutoff function without stopping the operation of the power converter 1 while leaving the output voltage generation through the original converter control unaffected; this allows the power converter 1 to have improved reliability.

Second Embodiment

In the first embodiment, the power converter 1 determines whether the gate shutoff function is normal or not for the two transistors Q11 and 012, namely one leg as a single transistor pair. In a second embodiment, a description is provided of a power converter that determines whether a gate shutoff function is normal or not for plural legs as plural transistor pairs.

Figure 5:
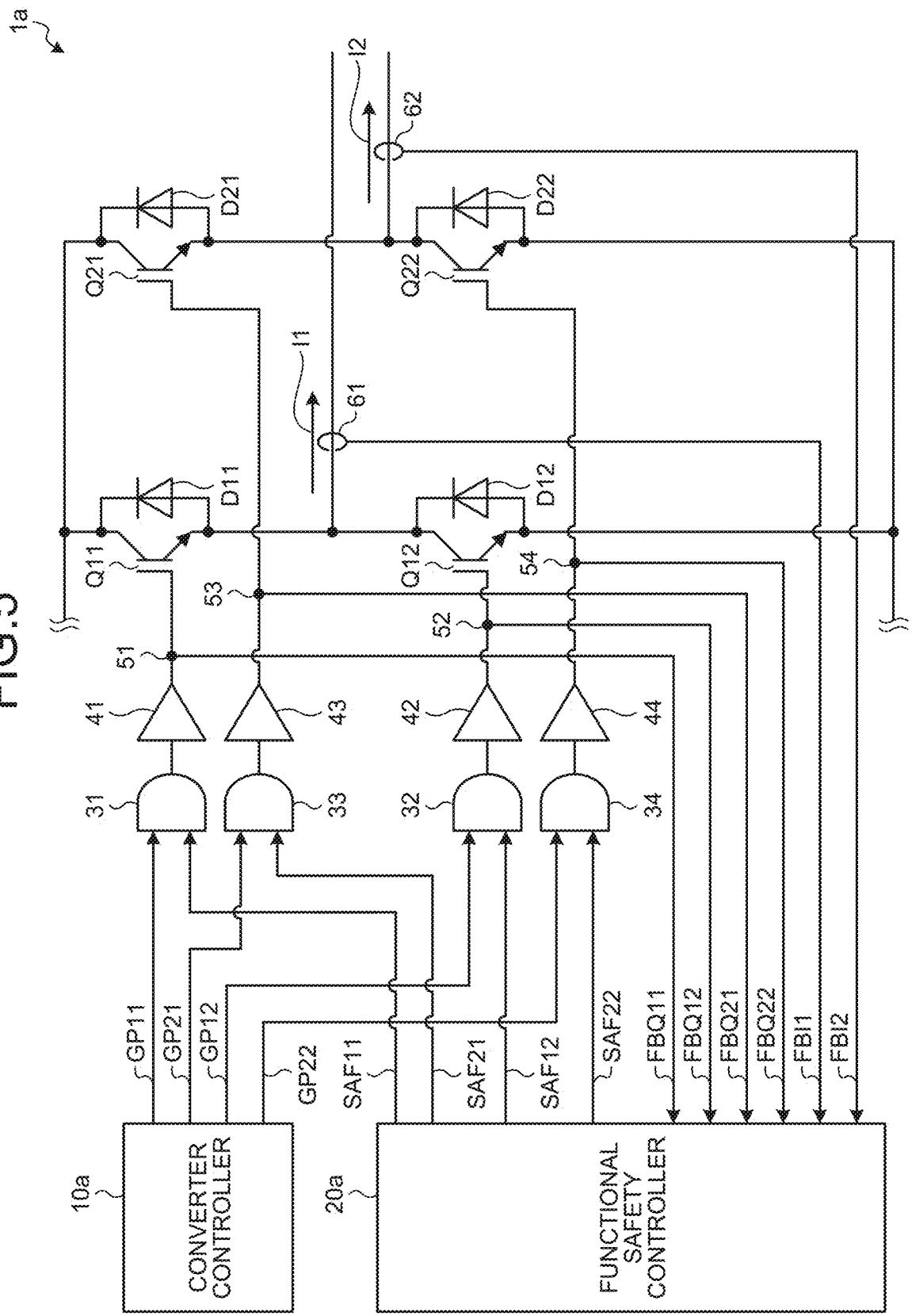
FIG. 5 is a diagram illustrating an exemplary configuration of a power converter according to a second embodiment.

FIG. 5 is a diagram illustrating an exemplary configuration of the power converter 1a according to the second embodiment. The power converter 1a includes: a converter controller 10a; a functional safety controller 20a; shutoff circuitries 31 to 34; gate drive circuitries 41 to 44; gate signal bifurcation units 51 to 54; transistors Q11, Q12, Q21, and Q22; freewheeling diodes D11, D12, D21, and D22; and current detectors 61 and 62. The power converter 1a according to the second embodiment has the plural transistors Q11, Q12, Q21, and Q22, that is to say, the plural legs. Corresponding to each of the plural transistors Q11, Q12, Q21, and Q22, the power converter 1a includes: plural shutoff circuitries 31 to 34; the plural gate drive circuitries 41 to 44; and the plural gate signal bifurcation units 51 to 54. The power converter 1a includes plural current detectors 61 and 62 corresponding to each of the plural legs. In the example of the second embodiment, the power converter 1a is described to have, as illustrated in FIG. 5, the four transistors Q11, Q12, Q21, and Q22, that is to say, the two legs as the two transistor pairs; however, a power converter that includes three or more legs is also possible.

The converter controller 10a is a controller that performs normal power conversion control in the power converter 1a. The converter controller 10a outputs gate pulses GP11 to the shutoff circuitry 31 for performing the power conversion control, namely on and off control of the transistor Q11 in a main circuit. Furthermore, the converter controller 10a outputs gate pulses GP12 to the shutoff circuitry 32 for performing the power conversion control, namely on and off control of the transistor Q12 in the main circuit. Furthermore, the converter controller 10a outputs gate pulses GP21 to the shutoff circuitry 33 for performing the power conversion control, namely on and off control of the transistor Q21 in the main circuit. Furthermore, the converter controller 10a outputs gate pulses GP22 to the shutoff circuitry 34 for performing the power conversion control, namely on and off control of the transistor Q22 in the main circuit. An example of the main circuit in the power converter 1a is an inverter that supplies power to an electric motor (not illustrated) or the like but is not limiting.

The functional safety controller 20a is a controller that performs functional safety control in the power converter 1a. The functional safety controller 20a outputs: a gate drive allowing signal SAF11 for functional safety control to the shutoff circuitry 31; a gate drive allowing signal SAF12 for functional safety control to the shutoff circuitry 32; a gate drive allowing signal SAF21 for functional safety control to the shutoff circuitry 33; and a gate drive allowing signal SAF22 for functional safety control to the shutoff circuitry 34. The functional safety controller 20a outputs the gate drive allowing signal SAF11 in the on state for the transistor Q11 when not determining the integrity of the gate shutoff function for the transistor Q11. The functional safety controller 20a outputs the gate drive allowing signal SAF12 in the on state for the transistor Q12 when not determining the integrity of the gate shutoff function for the transistor Q12. The functional safety controller 20a outputs the gate drive allowing signal SAF21 in the on state for the transistor Q21 when not determining the integrity of the gate shutoff function for the transistor Q21. The functional safety controller 20a outputs the gate drive allowing signal SAF22 in the on state for the transistor Q22 when not determining the integrity of the gate shutoff function for the transistor Q22.

Corresponding to the transistor Q21, the shutoff circuitry 33 outputs a drive signal in the on state to drive the gate drive circuitry 43 when a gate pulse GP21 output from the converter controller 10a and the gate drive allowing signal SAF21 output from the functional safety controller 20a are both on. Specifically, the shutoff circuitry 33 is an AND circuit that performs a logical conjunction using the gate pulse GP21 and the gate drive allowing signal SAF21 and outputs a result of the logical conjunction as the drive signal. Similarly, corresponding to the transistor Q22, the shutoff circuitry 34 outputs a drive signal in the on state to drive the gate drive circuitry 44 when a gate pulse GP22 output from the converter controller 10a and the gate drive allowing signal SAF22 output from the functional safety controller 20a are both on. Specifically, the shutoff circuitry 34 is an AND circuit that performs a logical conjunction using the gate pulse GP22 and the gate drive allowing signal SAF22 and outputs a result of the logical conjunction as the drive signal. The shutoff circuitries 31 and 32 operate as in the first embodiment.

Since the shutoff circuitry 33 operates as described above, the functional safety controller 20a is enabled to put the output of the shutoff circuitry 33 into the off state by putting the gate drive allowing signal SAF21 for the shutoff circuitry 33 into the off state. In other words, the functional safety controller 20a in the power converter 1a can shut off the gate pulse GP21, which is output from the converter controller 10a for the normal power conversion control, to put the transistor Q21 into the gate-off state. Similarly, since the shutoff circuitry 34 operates as described above, the functional safety controller 20a is enabled to put the output of the shutoff circuitry 34 into the off state by putting the gate drive allowing signal SAF22 for the shutoff circuitry 34 into the off state. In other words, the functional safety controller 20a in the power converter 1a can shut off the gate pulse GP22, which is output from the converter controller 10a for the normal power conversion control, to put the transistor Q22 into the gate-off state. The functional safety controller 20a operates in the same manner for the shutoff circuitries 31 and 32 as the functional safety controller 20 operates for the shutoff circuitries 31 and 32 in the first embodiment.

Corresponding to the transistor Q21, the gate drive circuitry 43 outputs a gate signal to drive the transistor Q21 on the basis of the drive signal output from the shutoff circuitry 33. In other words, the gate drive circuitry 43 drives the transistor Q21 according to the drive signal output from the shutoff circuitry 33. Specifically, the gate drive circuitry 43 outputs the gate signal in the on state when the drive signal is on and outputs the gate signal in the off state when the drive signal is off. Similarly, corresponding to the transistor Q22, the gate drive circuitry 44 outputs a gate signal to drive the transistor Q22 on the basis of the drive signal output from the shutoff circuitry 34. In other words, the gate drive circuitry 44 drives the transistor Q22 according to the drive signal output from the shutoff circuitry 34. Specifically, the gate drive circuitry 44 outputs the gate signal in the on state when the drive signal is on and outputs the gate signal in the off state when the drive signal is off. The gate drive circuitries 41 and 42 operate as in the first embodiment.

The gate signal bifurcation unit 53 bifurcates the gate signal that the gate drive circuitry 43 outputs to the transistor Q21. The gate signal bifurcation unit 53 outputs one of the bifurcated gate signals to the transistor Q21 and feeds back to the functional safety controller 20a the other bifurcated gate signal in the form of a gate signal FBQ21 as a feedback signal for the functional safety controller 20a. Similarly, the gate signal bifurcation unit 54 bifurcates the gate signal that the gate drive circuitry 44 outputs to the transistor Q22. The gate signal bifurcation unit 54 outputs one of the bifurcated gate signals to the transistor Q22 and feeds back to the functional safety controller 20a the other bifurcated gate signal in the form of a gate signal FBQ22 as a feedback signal for the functional safety controller 20a. The gate signal bifurcation units 51 and 52 operate as in the first embodiment.

Similarly to the gate signal bifurcation units 51 and 52, the gate signal bifurcation unit 53 bifurcates the gate signal output from the gate drive circuitry 43 to the transistor Q21 so that the gate signal FBQ21 to be fed back to the functional safety controller 20a has a current value less than or equal to a specified current value. Taking into consideration the amount of current to be distributed to the functional safety controller 20a by the gate signal bifurcation unit 53, the shutoff circuitry 33 may output a drive signal with a greater current value in advance to ensure a necessary amount of current for controlling operation of the transistor Q21. The gate signal bifurcation unit 54 bifurcates the gate signal output from the gate drive circuitry 44 to the transistor Q22 so that the gate signal FBQ22 to be fed back to the functional safety controller 20a has a current value less than or equal to a specified current value. Taking into consideration the amount of current to be distributed to the functional safety controller 20a by the gate signal bifurcation unit 54, the shutoff circuitry 34 may output a drive signal with a greater current value in advance to ensure a necessary amount of current for controlling operation of the transistor Q22. Large currents may be prevented from flowing to the functional safety controller 20a in the power converter 1a by adjusting input impedances of the transistors Q21 and Q22 and the functional safety controller 20a. In that case, each of the gate signal bifurcation units 53 and 54 does not have to have the above-described function.

The transistor Q21 is a switching device that is included in the main circuit to perform power conversion in the power converter 1a. The power conversion transistor Q21 to be used for power conversion turns on and off according to the gate signal, which is output from the gate drive circuitry 43. Specifically, the transistor Q21 enters the gate-on state when the gate signal is on and the gate-off state when the gate signal is off. Similarly, the transistor Q22 is a switching device that is included in the main circuit to perform power conversion in the power converter 1a. The power conversion transistor Q22 to be used for power conversion turns on and off according to the gate signal, which is output from the gate drive circuitry 44. Specifically, the transistor Q22 enters the gate-on state when the gate signal is on and the gate-off state when the gate signal is off. In the second embodiment, the transistors Q21 and Q22 do not enter the gate-on state simultaneously. The transistors Q11 and Q12 operate as in the first embodiment.

The freewheeling diode D21 is a diode connected in parallel with the transistor Q21. Similarly, the freewheeling diode D22 is a diode connected in parallel with the transistor Q22. The freewheeling diodes D11 and D12 function as in the first embodiment.

The current detector 62 detects current I2 flowing through a phase that includes the transistors Q21 and Q22. The current I2 flowing through the phase refers to the current flowing through an interconnect line between the power converter 1a and the electric motor (not illustrated) or the like to which the power converter 1a supplies the power. Specifically, the current detector 62 detects the current I2 that flows through: the transistor Q21; or the freewheeling diode D21; or the transistor Q22; or the freewheeling diode D22. The current detector 62 outputs a detection result, namely the detected current I2, to the functional safety controller 20a in the form of a current value FBI2 as a feedback signal for the functional safety controller 20a. The current I2 is positive when flowing in a direction indicated by an arrow in FIG. 5 and negative when flowing in a direction opposite to the arrow in FIG. 5. In the example of FIG. 5, the current I2 is positive when flowing through the transistor Q21 or the freewheeling diode D22 and negative when flowing through the freewheeling diode D21 or the transistor Q22. The current detector 61 operates as in the first embodiment.

The functional safety controller 20a monitors: the gate signal FBQ11 being fed back from the gate signal bifurcation unit 51; the gate signal FBQ12 being fed back from the gate signal bifurcation unit 52; the gate signal FBQ21 being fed back from the gate signal bifurcation unit 53; the gate signal FBQ22 being fed back from the gate signal bifurcation unit 54; the current value FBI1 being output from the current detector 61; and the current value FBI2 being output from the current detector 62. In other words, the functional safety controller 20a monitors: the gate signal being output from the gate drive circuitry 41 to the transistor Q11; the gate signal being output from the gate drive circuitry 42 to the transistor Q12; the gate signal being output from the gate drive circuitry 43 to the transistor Q21; the gate signal being output from the gate drive circuitry 44 to the transistor Q22; the current I1 flowing through the transistor Q11, the freewheeling diode D11, the transistor Q12, or the freewheeling diode D12; and the current I2 flowing through the transistor Q21, the freewheeling diode D21, the transistor Q22, or the freewheeling diode D22.

Next, a description is provided of a mechanism for verifying the integrity of the gate shutoff function in the power converter 1a. In the second embodiment, the gate shutoff function refers to the feature of putting the transistors Q11, Q12, Q21, and Q22 into the gate-off state when some anomaly is detected in the power converter 1a.

In the power converter 1a, the current I1 flows through the transistor Q11 or the freewheeling diode D12 in the positive direction and flows through the freewheeling diode D11 or the transistor Q12 in the negative direction. The current I1 flowing through the freewheeling diode D11 keeps on flowing through the freewheeling diode D11 without flowing through the transistor Q11 even when the transistor Q11 enters the gate-on state. Therefore, even if the transistor Q11 is put into the gate-on state while the current I1 flows in the negative direction, the current I1 does not flow through the transistor Q11, meaning that output voltage generation of the power converter 1a through the original converter control is unaffected. Similarly, the current I1 flowing through the freewheeling diode D12 keeps on flowing through the freewheeling diode D12 without flowing through the transistor Q12 even when the transistor Q12 enters the gate-on state. Therefore, even if the transistor Q12 is put into the gate-on state while the current I1 flows in the positive direction, the current I1 does not flow through the transistor Q12, meaning that the output voltage generation of the power converter 1a through the original converter control is unaffected.

Since the current value FBI1 is fed back from the current detector 61, the functional safety controller 20a can detect whether the flowing direction of the current I1 is positive or negative on the basis of the current value FBI1. Furthermore, since the gate signal FBQ11 is fed back from the gate signal bifurcation unit 51, the functional safety controller 20a can detect the state of the gate signal applied to the transistor Q11. Given these, the functional safety controller 20a first detects the period when the current I1 flows in the negative direction on the basis of the current value FBI1 fed back from the current detector 61. Even during the period when the current I1 flows in the negative direction, regardless of how the functional safety controller 20a or the like operates, the converter controller 10a controls operation of a device connected to the power converter 1a as during the period when the current I1 flows in the positive direction, appropriately outputting a gate pulse GP11 in the on or off state.

Since, as described earlier, the functional safety controller 20a outputs the gate drive allowing signal SAF11 in the on state under normal conditions, the shutoff circuitry 31 outputs the drive signal in the on state to the gate drive circuitry 41 when a gate pulse GP11 set by the converter controller 10a is on. As a result, the gate drive circuitry 41 outputs the gate signal in the on state to the transistor Q11 on the basis of the drive signal in the on state from the shutoff circuitry 31. The gate signal bifurcation unit 51 bifurcates the gate signal output in the on state from the gate drive circuitry 41 to the transistor Q11, thus feeding back the gate signal FBQ11 to the functional safety controller 20a. With the gate signal FBQ11, which is the feedback from the gate signal bifurcation unit 51, the functional safety controller 20a can detect that the gate signal output from the gate drive circuitry 41 is on.

The functional safety controller 20a turns off the gate drive allowing signal SAF11 while the gate drive circuitry 41 outputs the gate signal in the on state in the period when the current I1 flows in the negative direction. Since the gate drive allowing signal SAF11 output from the functional safety controller 20a has entered the off state, the shutoff circuitry 31 outputs the drive signal in the off state to the gate drive circuitry 41. On the basis of the drive signal in the off state from the shutoff circuitry 31, the gate drive circuitry 41 outputs the gate signal in the off state to the transistor Q11. The gate signal bifurcation unit 51 bifurcates the gate signal output in the off state from the gate drive circuitry 41 to the transistor Q11 to feed back the gate signal FBQ11 to the functional safety controller 20a.

With the gate signal FBQ11, which is the feedback from the gate signal bifurcation unit 51, the functional safety controller 20a can detect that the gate signal output from the gate drive circuitry 41 is off. The gate signal for the transistor Q11 has turned off as a result of turning off the gate drive allowing signal SAF11. This allows the functional safety controller 20a to determine that the gate shutoff function is normal. If after turning off the gate drive allowing signal SAF11 while the gate drive circuitry 41 outputs the gate signal in the on state in the period when the current I1 flows in the negative direction, the functional safety controller 20a cannot detect on the basis of the gate signal FBQ11, which is the feedback from the gate signal bifurcation unit 51, that the gate signal output from the gate drive circuitry 41 is off, the functional safety controller 20a determines that the gate shutoff function is anomalous.

The functional safety controller 20a checks whether or not the gate signal FBQ12 turns off by putting the gate drive allowing signal SAF12 into the off state while the transistor Q12 is in the gate-on state in the period when the current I1 flows in the positive direction, thereby determining the integrity of the gate shutoff function for the transistor Q12.

Similarly, the current I2 in the power converter 1a flows through the transistor Q21 or the freewheeling diode D22 in the positive direction and flows through the freewheeling diode D21 or the transistor Q22 in the negative direction. The current I2 flowing through the freewheeling diode D21 keeps on flowing through the freewheeling diode D21 without flowing through the transistor Q21 even when the transistor Q21 enters the gate-on state. Therefore, even if the transistor Q21 is put into the gate-on state while the current I2 flows in the negative direction, the current I2 does not flow through the transistor Q21, meaning that the output voltage generation of the power converter 1a through the original converter control is unaffected. Similarly, the current I2 flowing through the freewheeling diode D22 keeps on flowing through the freewheeling diode D22 without flowing through the transistor Q22 even when the transistor Q22 enters the gate-on state. Therefore, even if the transistor Q22 is put into the gate-on state while the current I2 flows in the positive direction, the current I2 does not flow through the transistor Q22, meaning that the output voltage generation of the power converter 1a through the original converter control is unaffected.

Since the current value FBI2 is fed back from the current detector 62, the functional safety controller 20a can detect whether the flowing direction of the current I2 is positive or negative on the basis of the current value FBI2. Furthermore, since the gate signal FBQ21 is fed back from the gate signal bifurcation unit 53, the functional safety controller 20a can detect the state of the gate signal applied to the transistor Q21. Given these, the functional safety controller 20a first detects the period when the current I2 flows in the negative direction on the basis of the current value FBI2 fed back from the current detector 62. Even during the period when the current I2 flows in the negative direction, regardless of how the functional safety controller 20a or the like operates, the converter controller 10a controls the operation of the device connected to the power converter 1a as during the period when the current I2 flows in the positive direction, appropriately outputting a gate pulse GP21 in the on or off state.

Since, as described earlier, the functional safety controller 20a outputs the gate drive allowing signal SAF21 in the on state under normal conditions, the shutoff circuitry 33 outputs the drive signal in the on state to the gate drive circuitry 43 when a gate pulse GP21 set by the converter controller 10a is on. As a result, the gate drive circuitry 43 outputs the gate signal in the on state to the transistor Q21 on the basis of the drive signal in the on state from the shutoff circuitry 33. The gate signal bifurcation unit 53 bifurcates the gate signal output in the on state from the gate drive circuitry 43 to the transistor Q21, thus feeding back the gate signal FBQ21 to the functional safety controller 20a. With the gate signal FBQ21, which is the feedback from the gate signal bifurcation unit 53, the functional safety controller 20a can detect that the gate signal output from the gate drive circuitry 43 is on.

The functional safety controller 20a turns off the gate drive allowing signal SAF21 while the gate drive circuitry 43 outputs the gate signal in the on state in the period when the current I2 flows in the negative direction. Since the gate drive allowing signal SAF21 output from the functional safety controller 20a has entered the off state, the shutoff circuitry 33 outputs the drive signal in the off state to the gate drive circuitry 43. On the basis of the drive signal in the off state from the shutoff circuitry 33, the gate drive circuitry 43 outputs the gate signal in the off state to the transistor Q21. The gate signal bifurcation unit 53 bifurcates the gate signal output in the off state from the gate drive circuitry 43 to the transistor Q21 to feed back the gate signal FBQ21 to the functional safety controller 20a.

With the gate signal FBQ21, which is the feedback from the gate signal bifurcation unit 53, the functional safety controller 20a can detect that the gate signal output from the gate drive circuitry 43 is off. The gate signal for the transistor Q21 has turned off as a result of turning off the gate drive allowing signal SAF21. This allows the functional safety controller 20a to determine that the gate shutoff function is normal. If after turning off the gate drive allowing signal SAF21 while the gate drive circuitry 43 outputs the gate signal in the on state in the period when the current I2 flows in the negative direction, the functional safety controller 20a cannot detect on the basis of the gate signal FBQ21, which is the feedback from the gate signal bifurcation unit 53, that the gate signal output from the gate drive circuitry 43 is off, the functional safety controller 20a determines that the gate shutoff function is anomalous.

The functional safety controller 20a checks whether or not the gate signal FBQ22 turns off by putting the gate drive allowing signal SAF22 into the off state while the transistor Q22 is in the gate-on state in the period when the current I2 flows in the positive direction, thereby determining the integrity of the gate shutoff function for the transistor Q22.

Figure 6:
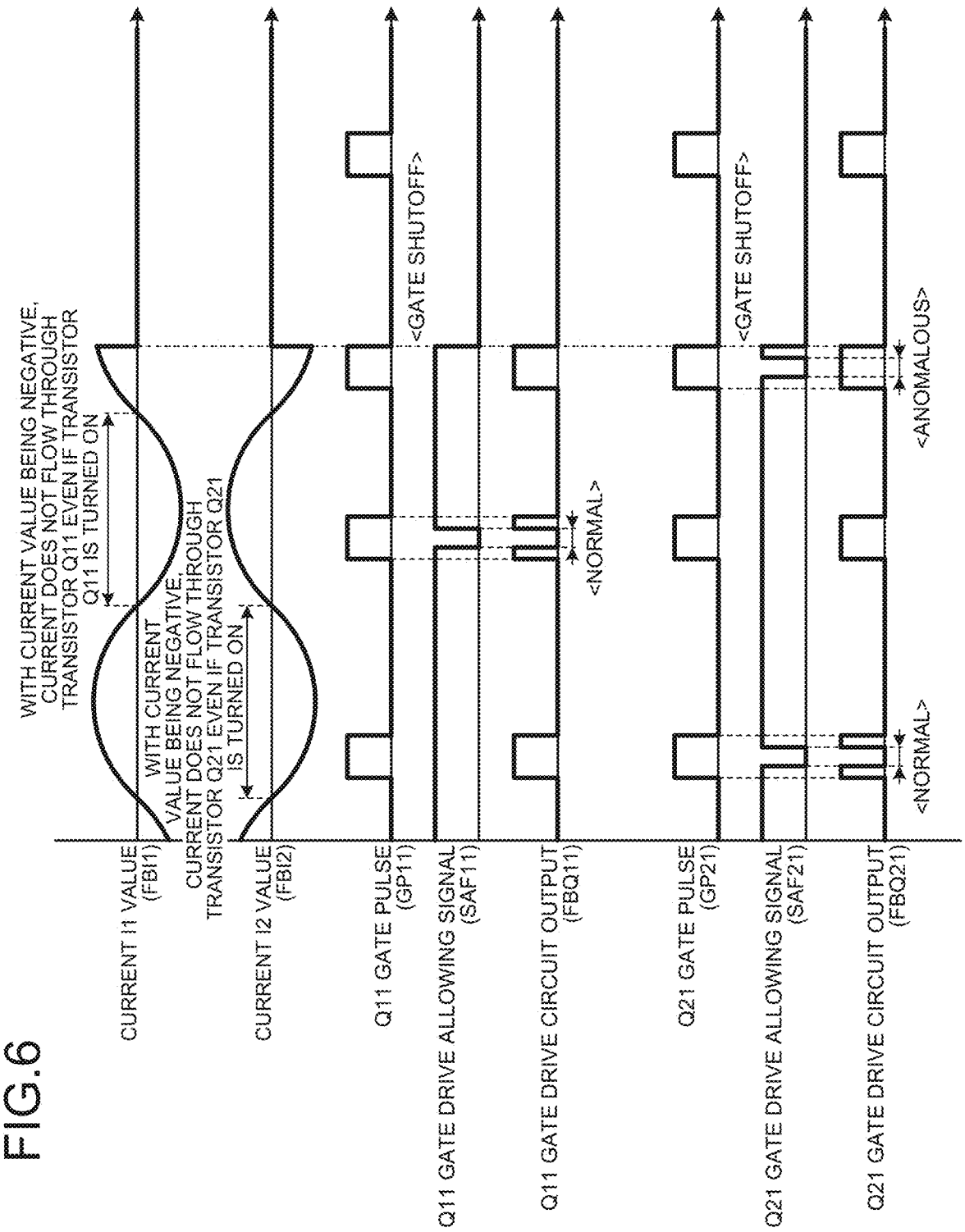
FIG. 6 is a first diagram illustrating exemplary operating waveforms of the power converter according to the second embodiment.

FIG. 6 is a first diagram illustrating exemplary operating waveforms of the power converter 1a according to the second embodiment. FIG. 7 is a second diagram illustrating exemplary operating waveforms of the power converter 1a according to the second embodiment. FIG. 6 illustrates an example where the gate shutoff function is anomalous for the transistor Q21, while FIG. 7 illustrates an example where the gate shutoff function is anomalous for the transistor Q11. In FIGS. 6 and 7, "current I1 value" corresponds to the current I1 being detected by the current detector 61 and refers to the current value FBI1 fed back from the current detector 61 to the functional safety controller 20a. "Current I2 value" corresponds to the current I2 being detected by the current detector 62 and refers to the current value FBI2 fed back from the current detector 62 to the functional safety controller 20a. "Q11gate pulse" refers to the gate pulse GP11 that is output from the converter controller 10a. "Q11 gate drive allowing signal" refers to the gate drive allowing signal SAF11 that is output from the functional safety controller 20a. "Q11 gate drive circuitry output" refers to the gate signal FBQ11 that is fed back from the gate signal bifurcation unit 51 to the functional safety controller 20a, corresponding to the gate signal that is output from the gate drive circuitry 41 to the transistor Q11. "Q21 gate pulse" refers to the gate pulse GP21 that is output from the converter controller 10a. "Q21 gate drive allowing signal" refers to the gate drive allowing signal SAF21 that is output from the functional safety controller 20a. "Q21 gate drive circuit output" refers to the gate signal FBQ21 that is fed back from the gate signal bifurcation unit 53 to the functional safety controller 20a, corresponding to the gate signal that is output from the gate drive circuitry 43 to the transistor Q21. Those signals relating to the transistor Q12, namely the gate pulse GP12, the gate drive allowing signal SAF12, and the gate signal FBQ12 are not illustrated. Those signals relating to the transistor Q22, namely the gate pulse GP22, the gate drive allowing signal SAF22, and the gate signal FBQ22 are not illustrated.

After confirming that the gate signal output from the gate drive circuitry 41, namely the gate signal FBQ11, has changed to the on state during the period of the current I1 flowing in the negative direction, the functional safety controller 20a puts the gate drive allowing signal SAF11 into a temporarily off state while the gate pulse GP11 is on. If the gate signal being output from the gate drive circuitry 41, namely the gate signal FBQ11, turns off accordingly, the functional safety controller 20a determines that the gate shutoff function is normal. If the functional safety controller 20a cannot detect that the gate signal being output from the gate drive circuitry 41, namely the gate signal FBQ11, turns off under the same condition as described above, the functional safety controller 20a determines that the gate shutoff function is anomalous. Similarly, after confirming that the gate signal output from the gate drive circuitry 43, namely the gate signal FBQ21, has changed to the on state during the period of the current I2 flowing in the negative direction, the functional safety controller 20a puts the gate drive allowing signal SAF21 into a temporarily off state while the gate pulse GP21 is on. If the gate signal being output from the gate drive circuitry 43, namely the gate signal FBQ21, turns off accordingly, the functional safety controller 20a determines that the gate shutoff function is normal. If the functional safety controller 20a cannot detect that the gate signal being output from the gate drive circuitry 43, namely the gate signal FBQ21, turns off under the same condition as described above, the functional safety controller 20a determines that the gate shutoff function is anomalous.

Here, the functional safety controller 20a is unaware of how long the converter controller 10a outputs the gate pulses GP11 and GP21 in the on state. However, if preset with information on the shortest duration for which the converter controller 10a keeps the gate pulse GP11 on when putting the gate pulse GP11 into the on state and the shortest duration for which the converter controller 10a keeps the gate pulse GP21 on when putting the gate pulse GP21 into the on state, the functional safety controller 20a can put each of the gate drive allowing signals SAF11 and SAF21 into the temporarily off state, that is to say, turn each of the gate drive allowing signals SAF11 and SAF21 off and then on again within the shortest duration for which the corresponding one of the gate pulses GP11 and GP21 is on to perform the above-described operation. The functional safety controller 20a may select on-periods that are shortest among periods when the gate signals FBQ11 and FBQ21, which are fed back from the gate signal bifurcation units 51 and 53, are on during the operation of the power converter 1a within a specified period, as the shortest durations for which the gate pulses GP11 and GP21 stay on. Alternatively, the functional safety controller 20a may put the gate drive allowing signals SAF11 and SAF21 into the temporarily off state during on-periods of subsequent gate pulses GP11 and GP21, the certain lengths of time for the subsequent gate pulses GP11 and GP21 to be on, which the functional safety controller 20a can anticipate securing on the basis of on-periods of previous gate pulses GP11 and GP21.

The functional safety controller 20a in the power converter 1a determines on the basis of the current value FBI1 and the gate signal FBQ11 whether or not the gate signal for the transistor Q11 changes to the off state by putting the gate drive allowing signal SAF11 into the temporarily off state while the gate signal is on in the period when the current I1 flows in the negative direction, that is to say, does not flow through the transistor Q11. In this way, the functional safety controller 20a determines the integrity of the gate shutoff function for the transistor Q11. Similarly, the functional safety controller 20a determines on the basis of the current value FBI2 and the gate signal FBQ21 whether or not the gate signal for the transistor Q21 changes to the off state by putting the gate drive allowing signal SAF21 into the temporarily off state while the gate signal is on in the period when the current I2 flows in the negative direction, that is to say, does not flow through the transistor Q21. In this way, the functional safety controller 20a determines the integrity of the gate shutoff function for the transistor Q21.

It is to be noted here that when an anomaly is detected in the determination of the integrity of the gate shutoff function for the transistor Q21, there is a possibility that, as illustrated in FIG. 6, even turning off the gate drive allowing signal SAF21 does not enable the functional safety controller 20a to turn off the gate signal FBQ21 serving as the feedback signal, namely the gate signal being output from the gate drive circuitry 43 to the transistor Q21. However, the functional safety controller 20a can turn off the gate signal being output from the gate drive circuitry 41 to the transistor Q11, the gate signal being output from the gate drive circuitry 42 to the transistor Q12, and the gate signal being output from the gate drive circuitry 44 to the transistor Q22 by turning off the gate drive allowing signals SAF11, SAF12, and SAF22 for the transistors Q11, Q12, and Q22. When an anomaly is detected in the determination of the integrity of the gate shutoff function for the transistor Q11, there is also a possibility that, as illustrated in FIG. 7, even turning off the gate drive allowing signal SAF11 does not enable the functional safety controller 20a to turn off the gate signal FBQ11 serving as the feedback signal, namely the gate signal being output from the gate drive circuitry 41 to the transistor Q11. However, the functional safety controller 20a can turn off the gate signal being output from the gate drive circuitry 42 to the transistor Q12, the gate signal being output from the gate drive circuitry 43 to the transistor Q21, and the gate signal being output from the gate drive circuitry 44 to the transistor Q22 by turning off the gate drive allowing signals SAF12, SAF21, and SAF22 for the transistors Q12, Q21, and Q22. In such cases, the functional safety controller 20a may issue an alarm to notify, for example, a user of the power converter 1a of the detected anomaly relating to the integrity of the gate shutoff function, and if stopping the operation of the power converter 1a is desired, the functional safety controller 20a may perform control that shuts off power supply to the converter controller 10a to stop the output of gate pulses GP11, GP12, GP21, and GP22 from the converter controller 10a.

While the description has been provided of how the functional safety controller 20a operates to determine the integrity of the gate shutoff function for the transistor Q11, the functional safety controller 20a operates in the same manner to determine the integrity of the gate shutoff function for the transistor Q12. In determining the integrity of the gate shutoff function for the transistor Q12, the functional safety controller 20a checks whether or not the gate signal FBQ12 turns off by putting the gate drive allowing signal SAF12 into the temporarily off state while the transistor Q12 is in the gate-on state, with the current I1 flowing in the positive direction. While the description has been provided of how the functional safety controller 20a operates to determine the integrity of the gate shutoff function for the transistor Q21, the functional safety controller 20a operates in the same manner to determine the integrity of the gate shutoff function for the transistor Q22. In determining the integrity of the gate shutoff function for the transistor Q22, the functional safety controller 20a checks whether or not the gate signal FBQ22 turns off by putting the gate drive allowing signal SAF22 into the temporarily off state while the transistor Q22 is in the gate-on state, with the current I2 flowing in the positive direction.

As described above, the functional safety controller 20a outputs the plural gate drive allowing signals in the on state correspondingly to the plural transistors when not determining the integrity of the gate shutoff function for the transistors. For each of the transistors, after confirming on the basis of the current value and the gate signal that the gate signal changes to the on state during the period of no current flow through the transistor, the functional safety controller 20a puts the gate drive allowing signal into the temporarily off state while the gate pulse is on to determine whether or not the gate signal changes to the off state.

In the second embodiment, the power converter 1a determines the gate shutoff function for each of the transistors Q11, Q12, Q21, and Q22 in the same way as the power converter 1 of the first embodiment, as illustrated in FIG. 3, determines the gate shutoff function for the transistor Q11. FIG. 8 is a flowchart illustrating how the power converter 1a according to the second embodiment operates. The operation illustrated in the flowchart of FIG. 8 refers to the operation to be performed after the power converter 1a carries out the method of determining the gate shutoff function for the transistors Q11, Q12, Q21, and Q22. The flowchart of FIG. 8 overlaps with the operation of step S17 in the flowchart of FIG. 3. If the gate shutoff function is normal for all the transistors (step S21: Yes), the functional safety controller 20a of the power converter 1a continues the operation of monitoring the gate shutoff function. If the gate shutoff function is anomalous for at least one of the transistors (step S21: No), the functional safety controller 20a turns off all the gate drive allowing signals SAF11, SAF12, SAF21, and SAF22 (step S22). As described above, when the functional safety controller 20a determines that the gate shutoff function is anomalous for at least one of the plural transistors Q11, Q12, Q21, and Q22, the functional safety controller 20a turns off the gate drive allowing signals SAF11, SAF12, SAF21, and SAF22, which correspond to all the plural transistors Q11, Q12, Q21, and Q22.

The power converter 1a according to the second embodiment has the same hardware configuration as the power converter 1 according to the first embodiment.

According to the second embodiment described above, the functional safety controller 20a of the power converter 1a determines the periods when the current I1 does not flow through the transistors Q11 and Q12 on the basis of the current value FBI1 from the current detector 61, determines the periods when the current I2 does not flow through the transistors Q21 and Q22 on the basis of the current value FBI2 from the current detector 62, and determines the on-periods of the gate signals on the basis of the gate signals FBQ11, FBQ12, FBQ21, and FBQ22 from the gate signal bifurcation units 51 to 54. The functional safety controller 20a puts the gate drive allowing signal SAF11 into the temporarily off state while the gate signal for the transistor Q11 is on in the period when the current I1 does not flow through the transistor Q11 to determine whether or not the gate signal for the transistor Q11 changes to the off state, thus determining the integrity of the gate shutoff function for the transistor Q11. Similarly, the functional safety controller 20a puts the gate drive allowing signal SAF12 into the temporarily off state while the gate signal for the transistor Q12 is on in the period when the current I1 does not flow through the transistor Q12 to determine whether or not the gate signal for the transistor Q12 changes to the off state, thus determining the integrity of the gate shutoff function for the transistor Q12. Similarly, the functional safety controller 20a puts the gate drive allowing signal SAF21 into the temporarily off state while the gate signal for the transistor Q21 is on in the period when the current I2 does not flow through the transistor Q21 to determine whether or not the gate signal for the transistor Q21 changes to the off state, thus determining the integrity of the gate shutoff function for the transistor Q21. Similarly, the functional safety controller 20a puts the gate drive allowing signal SAF22 into the temporarily off state while the gate signal for the transistor Q22 is on in the period when the current I2 does not flow through the transistor Q22 to determine whether or not the gate signal for the transistor Q22 changes to the off state, thus determining the integrity of the gate shutoff function for the transistor Q22. In this way, the functional safety controller 20a can verify the integrity of the gate shutoff function for the transistors Q11, Q12, Q21, and Q22, which are used for power conversion, without affecting the normal operation of the power converter 1a.

The above configurations illustrated in the embodiments are illustrative, can be combined with other techniques that are publicly known, and can be partly omitted or changed without departing from the gist. The embodiments can be combined with each other.

REFERENCE SIGNS LIST 1, 1a power converter; 10, 10a converter controller; 20, 20a functional safety controller; 31 to 34 shutoff circuitry; 41 to 44 gate drive circuitry; 51 to 54 gate signal bifurcation unit; 61, 62 current detector; D11, D12, D21, D22 freewheeling diode; Q11, Q12, Q21, Q22 transistor.

The invention claimed is:

1. A power converter comprising:
a pair of transistors connected in series to be used in power conversion;
a converter controller configured to output a gate pulse specific to each of the transistors in performing on and off control of the transistors;
a functional safety controller configured to output a gate drive allowing signal specific to each of the transistors in an on state when not determining integrity of a gate shutoff function for the transistors;
a pair of shutoff circuitries, corresponding to the pair of transistors respectively, each configured to output a result of a logical conjunction that uses the gate pulse and the gate drive allowing signal;
a pair of gate drive circuitries corresponding to the pair of transistors respectively, each configured to output a gate signal to drive the transistor on a basis of the drive signal to the transistor and the functional safety controller; and
a current detector configured to detect current flowing through a phase including the pair of transistors and configured to output a detection result as a current value to the functional safety controller, wherein
for each of the transistors, after confirming on a basis of the current value and the gate signal that the gate signal changes to an on state during a period of no current flow through the transistor, the functional safety controller is configured to:
put the gate drive allowing signal into a temporarily off state while the gate pulse is on; and
determine whether or not the gate signal changes to an off state.

2. The power converter according to claim 1, wherein upon determining an anomaly in the gate shutoff function for one of the transistors, the functional safety controller is configured to turn off the gate drive allowing signal for each of the pair of transistors.

3. The power converter according to claim 1, wherein the power converter comprises:
a plurality of legs each including the pair of transistors connected in series;
a plurality of the pairs of shutoff circuitries corresponding respectively to the plural pairs of transistors and a plurality of the pairs of gate drive circuitries corresponding to the plural pairs of transistors respectively, and
a plurality of the current detectors corresponding to the plurality of legs respectively, wherein
the converter controller is configured to output a plurality of the gate pulses for performing the on and off control of the plural pairs of transistors, wherein
the functional safety controller is configured to:
output a plurality of the gate drive allowing signals in the on state correspondingly to the plural transistors when not determining integrity of a gate shutoff function for the transistors;
confirm that the gate signal changes to the on state during a period of no current flow through the transistor for each of the transistors on the basis of the current value and the gate signal;
put the gate drive allowing signal into the temporarily off state while the gate pulse is on; and
determine whether or not the gate signal changes to the off state.

4. The power converter according to claim 3, wherein upon determining an anomaly in the gate shutoff function for at least one of the transistors, the functional safety controller is configured to turn off the gate drive allowing signals for all the plural transistors.

* * * * *